United States Patent
Klein

(10) Patent No.: US 7,526,713 B2
(45) Date of Patent: *Apr. 28, 2009

(54) LOW POWER COST-EFFECTIVE ECC MEMORY SYSTEM AND METHOD

(75) Inventor: Dean A. Klein, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 232 days.

This patent is subject to a terminal disclaimer.

(21) Appl. No.: 11/432,009

(22) Filed: May 10, 2006

(65) Prior Publication Data

US 2006/0218469 A1 Sep. 28, 2006

Related U.S. Application Data

(63) Continuation of application No. 10/877,720, filed on Jun. 25, 2004, now Pat. No. 7,340,668.

(51) Int. Cl.
*G11C 29/00* (2006.01)

(52) U.S. Cl. .................. 714/763; 714/710; 714/718; 714/785; 360/53; 365/200; 365/201

(58) Field of Classification Search .......... 714/763, 714/710, 718, 785; 360/53; 365/200, 201
See application file for complete search history.

(56) References Cited

U.S. PATENT DOCUMENTS

| 4,334,295 A | 6/1982 | Nagami | 365/222 |
|---|---|---|---|
| 4,433,211 A | 2/1984 | McCalmont et al. | 179/1.5 S |
| 4,598,402 A | 7/1986 | Matsumoto et al. | 371/38 |
| 4,706,249 A | 11/1987 | Nakagawa et al. | 371/38 |
| 4,710,934 A | 12/1987 | Traynor | 371/38 |
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,918,692 A | 4/1990 | Hidaka et al. | 371/2.2 |
| 4,937,830 A | 6/1990 | Kawashima et al. | 371/40.1 |
| 4,958,325 A | 9/1990 | Nakagome et al. | 365/206 |
| 5,056,089 A | 10/1991 | Furuta et al. | 371/3 |
| 5,127,014 A * | 6/1992 | Raynham | 714/754 |

(Continued)

OTHER PUBLICATIONS

J. Stojko et al. (IBM Technical Disclosure Bulletin) pp. 1437 and 1438, vol. 10 No. 10 Mar. 1968.*

(Continued)

*Primary Examiner*—Esaw T Abraham
(74) *Attorney, Agent, or Firm*—Dorsey & Whitney LLP

(57) ABSTRACT

A memory controller couples 32-bit data words to and from a DRAM. The DRAM generates error checking and correcting syndromes to check and correct read data. The DRAM generates the syndromes from respective 128-bit data words each formed by 4 32-bit data words written to the DRAM, and thereby achieves a low syndrome bit overhead. The memory controller may write data words to the DRAM having less than 128 bits by first reading 4 32-bit words from the DRAM, substituting the write data for a corresponding number of bits of read data, and writing the new 128-bit word to the DRAM by writing 4 32-bit words.

57 Claims, 5 Drawing Sheets

U.S. PATENT DOCUMENTS

| | | | |
|---|---|---|---|
| 5,172,339 A | 12/1992 | Noguchi et al. | 365/201 |
| 5,278,796 A | 1/1994 | Tillinghast et al. | 365/211 |
| 5,291,498 A | 3/1994 | Jackson et al. | 371/40.1 |
| 5,307,356 A * | 4/1994 | Fifield | 714/765 |
| 5,313,425 A | 5/1994 | Lee et al. | 365/201 |
| 5,313,464 A | 5/1994 | Reiff | 371/2.1 |
| 5,313,475 A | 5/1994 | Cromer et al. | 371/40.1 |
| 5,313,624 A | 5/1994 | Harriman et al. | 395/575 |
| 5,321,661 A | 6/1994 | Iwakiri et al. | 365/222 |
| 5,335,201 A | 8/1994 | Walther et al. | 365/222 |
| 5,369,651 A | 11/1994 | Marisetty | 371/40.1 |
| 5,418,796 A | 5/1995 | Price et al. | 371/39.1 |
| 5,428,630 A | 6/1995 | Weng et al. | 371/40.1 |
| 5,432,802 A | 7/1995 | Tsuboi | 371/40.1 |
| 5,446,695 A | 8/1995 | Douse et al. | 365/222 |
| 5,448,578 A | 9/1995 | Kim | 371/40.4 |
| 5,450,424 A | 9/1995 | Okugaki et al. | 371/40.1 |
| 5,455,801 A | 10/1995 | Blodgett et al. | 365/222 |
| 5,459,742 A | 10/1995 | Cassidy et al. | 371/40.1 |
| 5,481,552 A | 1/1996 | Aldereguia et al. | 371/40.1 |
| 5,509,132 A | 4/1996 | Matsuda et al. | 395/403 |
| 5,513,135 A | 4/1996 | Dell et al. | 365/52 |
| 5,515,333 A | 5/1996 | Fujita et al. | 365/229 |
| 5,588,112 A | 12/1996 | Dearth et al. | 395/182.07 |
| 5,600,662 A | 2/1997 | Zook | 371/40.1 |
| 5,604,703 A | 2/1997 | Nagashima | 365/200 |
| 5,623,506 A | 4/1997 | Dell et al. | 371/40.1 |
| 5,629,898 A | 5/1997 | Idei et al. | 365/222 |
| 5,631,914 A | 5/1997 | Kashida et al. | 371/37.4 |
| 5,703,823 A | 12/1997 | Douse et al. | 365/222 |
| 5,706,225 A | 1/1998 | Buchenrieder et al. | 365/102 |
| 5,712,861 A | 1/1998 | Inoue et al. | 371/37.1 |
| 5,732,092 A | 3/1998 | Shinohara | 371/40.2 |
| 5,740,188 A | 4/1998 | Olarig | 371/40.11 |
| 5,754,753 A | 5/1998 | Smelser | 395/182.06 |
| 5,761,222 A | 6/1998 | Baldi | 371/40.18 |
| 5,765,185 A | 6/1998 | Lambrache et al. | 711/103 |
| 5,784,328 A | 7/1998 | Irrinki et al. | 365/222 |
| 5,784,391 A * | 7/1998 | Konigsburg | 714/773 |
| 5,808,952 A | 9/1998 | Fung et al. | 365/222 |
| 5,841,418 A | 11/1998 | Bril et al. | 345/3 |
| 5,864,569 A | 1/1999 | Roohparvar | 371/40.18 |
| 5,878,059 A | 3/1999 | Maclellan | 371/40.13 |
| 5,896,404 A | 4/1999 | Kellogg et al. | 371/40.11 |
| 5,912,906 A | 6/1999 | Wu et al. | 371/40.11 |
| 5,953,278 A | 9/1999 | McAdams et al. | 365/219 |
| 5,961,660 A | 10/1999 | Capps, Jr. et al. | 714/763 |
| 5,963,103 A | 10/1999 | Blodgett | 331/75 |
| 6,009,547 A | 12/1999 | Jaquette et al. | 714/758 |
| 6,009,548 A | 12/1999 | Chen et al. | 714/762 |
| 6,018,817 A | 1/2000 | Chen et al. | 714/762 |
| 6,041,001 A | 3/2000 | Estakhri | 365/200 |
| 6,041,430 A | 3/2000 | Yamauchi | 714/752 |
| 6,085,283 A | 7/2000 | Toda | 711/104 |
| 6,085,334 A | 7/2000 | Giles et al. | 714/7 |
| 6,092,231 A | 7/2000 | Sze | 714/758 |
| 6,101,614 A | 8/2000 | Gonzales et al. | 714/6 |
| 6,125,467 A | 9/2000 | Dixon | 714/763 |
| 6,134,167 A | 10/2000 | Atkinson | 365/222 |
| 6,178,537 B1 | 1/2001 | Roohparvar | 714/773 |
| 6,199,139 B1 | 3/2001 | Katayama et al. | 711/106 |
| 6,212,118 B1 | 4/2001 | Fujita | 365/222 |
| 6,212,631 B1 | 4/2001 | Springer et al. | 713/1 |
| 6,216,246 B1 | 4/2001 | Shau | 714/763 |
| 6,216,247 B1 | 4/2001 | Creta et al. | 714/763 |
| 6,219,807 B1 | 4/2001 | Ebihara et al. | 714/720 |
| 6,223,309 B1 | 4/2001 | Dixon et al. | 714/703 |
| 6,233,717 B1 | 5/2001 | Choi | 714/805 |
| 6,262,925 B1 | 7/2001 | Yamasaki | 365/200 |
| 6,279,072 B1 | 8/2001 | Williams et al. | 711/105 |
| 6,310,825 B1 | 10/2001 | Furuyama | 365/233 |
| 6,324,119 B1 | 11/2001 | Kim | 365/233 |
| 6,349,068 B1 | 2/2002 | Takemae et al. | 365/222 |
| 6,349,390 B1 | 2/2002 | Dell et al. | 714/6 |
| 6,353,910 B1 | 3/2002 | Carnevale et al. | 714/763 |
| 6,397,290 B1 | 5/2002 | Williams et al. | 711/105 |
| 6,397,357 B1 | 5/2002 | Cooper | 714/703 |
| 6,397,365 B1 | 5/2002 | Brewer et al. | 714/766 |
| 6,438,066 B1 | 8/2002 | Ooishi et al. | 365/233 |
| 6,442,644 B1 | 8/2002 | Gustavson et al. | 711/105 |
| 6,457,153 B2 | 9/2002 | Yamamoto et al. | 714/763 |
| 6,484,246 B2 | 11/2002 | Tsuchida et al. | 711/169 |
| 6,510,537 B1 | 1/2003 | Lee | 714/763 |
| 6,526,537 B2 | 2/2003 | Kishino | 714/763 |
| 6,549,460 B2 * | 4/2003 | Nozoe et al. | 365/185.09 |
| 6,556,497 B2 | 4/2003 | Cowles et al. | 365/222 |
| 6,557,072 B2 | 4/2003 | Osborn | 711/106 |
| 6,560,155 B1 | 5/2003 | Hush | 365/222 |
| 6,584,543 B2 | 6/2003 | Williams et al. | 711/105 |
| 6,591,394 B2 | 7/2003 | Lee et al. | 714/766 |
| 6,594,796 B1 | 7/2003 | Chiang | 714/800 |
| 6,601,211 B1 | 7/2003 | Norman | 714/773 |
| 6,603,694 B1 | 8/2003 | Frankowsky et al. | 365/222 |
| 6,609,236 B2 | 8/2003 | Watanabe et al. | 716/8 |
| 6,614,698 B2 | 9/2003 | Ryan et al. | 365/189.04 |
| 6,618,281 B1 | 9/2003 | Gordon | 365/49 |
| 6,618,319 B2 | 9/2003 | Ooishi et al. | 365/233 |
| 6,628,558 B2 | 9/2003 | Fiscus | 365/222 |
| 6,636,444 B2 | 10/2003 | Uchida et al. | 365/189.05 |
| 6,636,446 B2 | 10/2003 | Lee et al. | 365/194 |
| 6,646,942 B2 | 11/2003 | Janzen | 365/222 |
| 6,662,333 B1 | 12/2003 | Zhang et al. | 714/767 |
| 6,665,231 B2 | 12/2003 | Mizuno et al. | 365/233 |
| 6,678,860 B1 | 1/2004 | Lee | 714/763 |
| 6,697,926 B2 | 2/2004 | Johnson et al. | 711/167 |
| 6,697,992 B2 | 2/2004 | Ito et al. | 714/763 |
| 6,701,480 B1 | 3/2004 | Karpuszka et al. | 714/764 |
| 6,704,230 B1 | 3/2004 | DeBrosse et al. | 365/201 |
| 6,715,104 B2 | 3/2004 | Imbert de Tremiolles et al. | 714/25 |
| 6,715,116 B2 | 3/2004 | Lester et al. | 714/718 |
| 6,735,726 B2 | 5/2004 | Muranaka et al. | 714/708 |
| 6,751,143 B2 | 6/2004 | Morgan et al. | 365/222 |
| 6,754,858 B2 | 6/2004 | Borkenhagen et al. | 714/720 |
| 6,775,190 B2 | 8/2004 | Setogawa | 365/193 |
| 6,778,457 B1 | 8/2004 | Burgan | 365/222 |
| 6,781,908 B1 | 8/2004 | Pelley et al. | 365/222 |
| 6,788,616 B2 | 9/2004 | Takahashi | 365/233 |
| 6,789,209 B1 | 9/2004 | Suzuki et al. | 713/401 |
| 6,792,567 B2 | 9/2004 | Laurent | 714/763 |
| 6,795,362 B2 | 9/2004 | Nakai et al. | 365/222 |
| 6,807,108 B2 | 10/2004 | Maruyama et al. | 365/189.05 |
| 6,810,449 B1 | 10/2004 | Barth et al. | 710/61 |
| 6,819,624 B2 | 11/2004 | Acharya et al. | 365/233 |
| 6,834,022 B2 | 12/2004 | Derner et al. | 365/222 |
| 6,934,199 B2 | 8/2005 | Johnson et al. | 365/194 |
| 6,940,773 B2 | 9/2005 | Poechmueller | 365/222 |
| 6,965,537 B1 | 11/2005 | Klein et al. | 365/222 |
| 7,027,337 B2 | 4/2006 | Johnson et al. | 365/194 |
| 7,096,407 B2 * | 8/2006 | Olarig | 714/768 |
| 7,099,221 B2 | 8/2006 | Klein | 365/222 |
| 7,116,602 B2 | 10/2006 | Klein | 365/222 |
| 7,117,420 B1 * | 10/2006 | Yeung et al. | 714/763 |
| 7,171,605 B2 | 1/2007 | White | 714/763 |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |

| | | | | | | |
|---|---|---|---|---|---|---|
| 2002/0184592 | A1 | 12/2002 | Koga et al. ................... 714/763 | 2004/0117723 A1 | 6/2004 | Foss ........................... 714/805 |
| 2003/0009721 | A1 | 1/2003 | Hsu et al. .................... 714/773 | 2004/0225944 A1 | 11/2004 | Brueggen ................... 714/758 |
| 2003/0070054 | A1 | 4/2003 | Williams et al. ............ 711/173 | 2005/0099868 A1 | 5/2005 | Oh .............................. 365/222 |
| 2003/0093744 | A1 | 5/2003 | Leung et al. ................ 714/763 | 2005/0122797 A1 | 6/2005 | Johnson et al. ............. 365/195 |
| 2003/0097608 | A1 | 5/2003 | Rodeheffer et al. ............ 714/7 | 2006/0152983 A1 | 7/2006 | Johnson et al. ............. 365/194 |
| 2003/0101405 | A1 | 5/2003 | Shibata ....................... 714/763 | 2007/0268756 A1 | 11/2007 | Johnson et al. ........ 365/189.01 |
| 2003/0149855 | A1 | 8/2003 | Shibata et al. .............. 711/200 | | | |
| 2003/0167437 | A1 | 9/2003 | DeSota et al. ............... 714/763 | | | |
| 2003/0191888 | A1 | 10/2003 | Klein ......................... 711/105 | | | |
| 2004/0008562 | A1 | 1/2004 | Ito et al. ...................... 365/223 | | | |
| 2004/0064646 | A1 | 4/2004 | Emerson et al. ............. 711/131 | | | |
| 2004/0083334 | A1 | 4/2004 | Chang et al. ................ 711/103 | | | |
| 2004/0098654 | A1 | 5/2004 | Cheng et al. ................ 714/758 | | | |

OTHER PUBLICATIONS

Stojko, J. et al., "*Error-Correction Code*", IBM Technical Disclosure Bulletin, vol. 10, No. 10, Mar. 1968.

* cited by examiner

LOW POWER COST-EFFECTIVE ECC MEMORY SYSTEM AND METHOD

CROSS-REFERENCE TO RELATED APPLICATION

This application is a continuation of pending U.S. patent application Ser. No. 10/877,720, filed Jun. 25, 2004.

TECHNICAL FIELD

This invention relates to dynamic random access memory ("DRAM") devices, and, more particularly, to a method and system for checking and correcting data read from memory devices in a manner that is cost-effective and consumes relatively little power.

BACKGROUND OF THE INVENTION

As the use of electronic devices, such as personal computers, continue to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such a notebook computers, typically include dynamic random access memory ("DRAM") devices that consume a substantial amount of power. As the data storage capacity and operating speeds of DRAM devices continues to increase, the power consumed by such devices has continued to increase in a corresponding manner.

In general, the power consumed by a DRAM device increases with both the capacity and the operating speed of the DRAM devices. The power consumed by DRAM devices is also affected by their operating mode. A DRAM device for example, will generally consume a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tends to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors during refresh as well as at other times is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data.

A computer system 10 employing typical ECC techniques is shown in FIG. 1. The computer system 10 includes a central processor unit ("CPU") 14 coupled to a system controller 16 through a processor bus 18. The system controller 16 is coupled to input/output ("I/O") devices (not shown) through a peripheral bus 20 and to an I/O controller 24 through an expansion bus 26. The I/O controller 24 is also connected to various peripheral devices (not shown) through an I/O bus 28.

The system controller 16 includes a memory controller 30 that is coupled to a dynamic random access memory ("DRAM") 32 through an address bus 36, a control bus 38, a syndrome bus 40, and a data bus 42. The DRAM 32 includes an array 34 of memory cells that stores data and a syndrome coupled through the data bus 42 and the syndrome bus 40, respectively. The locations in the DRAM 32 to which data are written and data are read are designated by addresses coupled to the DRAM 32 on the address bus 36. The operation of the DRAM is controlled by control signals coupled to the DRAM 32 on the control bus 38.

In operation, when data are to be written to the DRAM 32, the memory controller 30 generates a syndrome and then couples the syndrome and the write data to the DRAM 32 through the syndrome bus 40 and the data bus 42, respectively. The memory controller 30 also couples control signals to the DRAM 32 through the control bus 38 and a memory address through the address bus 36. The data are then stored in an array 34 of DRAM memory cells. When the stored data are to be read from the DRAM. 32, the memory controller 30 applies control signals to the DRAM 32 through the control bus 38 and a memory address to the DRAM 32 through the address bus 36. Read data and the corresponding syndrome are then coupled from the DRAM 32 to the memory controller 30 through the data bus 42 and syndrome bus 40, respectively. The memory controller 30 then uses the syndrome to determine if any bits of the read data are in error, if not too many bits are in error, to correct the read data.

The use of ECC techniques can significantly improve the reliability of data stored in the DRAM 32. Furthermore, the use of ECC techniques can allow the DRAM to be refreshed at a slower refresh rate since resulting data bit errors can be corrected. The use of a slower refresh rate can provide the significant advantage of reducing the power consumed by the DRAM 32. However, the need to perform ECC processing on read data all during refresh can consume a significant amount of power. Further, the use of ECC techniques requires that a significant portion of the DRAM storage capacity be used to store the syndromes, thus requiring that the size of the DRAM semiconductor die be increased to maintain the storage capacity of the DRAM 32. Further, to the extent that power is required to store the syndromes, the use of ECC techniques can increase power consumption. The amount of power consumed by storage of the syndrome each time data are written to the DRAM 32 is a function of the number of bits in the syndrome. The size of the syndrome needed to correct single bit error is determined by the number of bits in the data being checked and corrected, and is given by the following table:

TABLE 1

| Data Bits | Syndrome Bits | Syndrome Bit Overhead |
| --- | --- | --- |
| 8 | 4 | 50% |
| 16 | 5 | 31% |
| 32 | 6 | 19% |
| 64 | 7 | 11% |
| 128 | 8 | 6% |

In general, the syndrome bit overhead, expressed as the ratio of the number of necessary syndrome bits (i.e., N+1) to the number of data bits (i.e., $_2N$), is equal to $(N+1)/2^N$. As the numerator increases linearly with N and the denominator increases geometrically with N, it is apparent that significantly greater efficiencies can be achieved with higher values of N, i.e., syndromes generated from a greater number of data bits. However, memory controllers generally do not write data to DRAMs or read data from DRAMs using very wide data paths. For example, in the computer system 10 shown in FIG. 1, the data bus 42 has a width of only 32 bits, and a 32-bit word would require 6 syndrome bits, which would result in a 16% syndrome overhead. As a result, the extent to which syndrome bit overhead can be reduced is very limited.

There is therefore a need for a memory system and method that detects and corrects errors in data stored in DRAMs while consuming relatively little power and consuming relatively little space on a semiconductor die, and which does not require substantial modifications in the operation of memory controllers that are coupled to the DRAMS.

SUMMARY OF THE INVENTION

An error checking and correcting memory device and method includes on-board circuitry for generating a syndrome from the data written to the memory device. The syndrome is generated from more bits of write data than the number of write data bits that can be simultaneously coupled to the memory device. More specifically, the syndrome is generated from several write data words that are sequentially coupled to the memory device. The memory device uses the syndrome to check and correct any data that are read from the memory device. The use of data having a large number of bits to generate the syndrome allows the syndrome bit overhead to be relatively low so that a significant amount of storage capacity is not used to store the syndrome.

DETAILED DESCRIPTION

Figure 1:
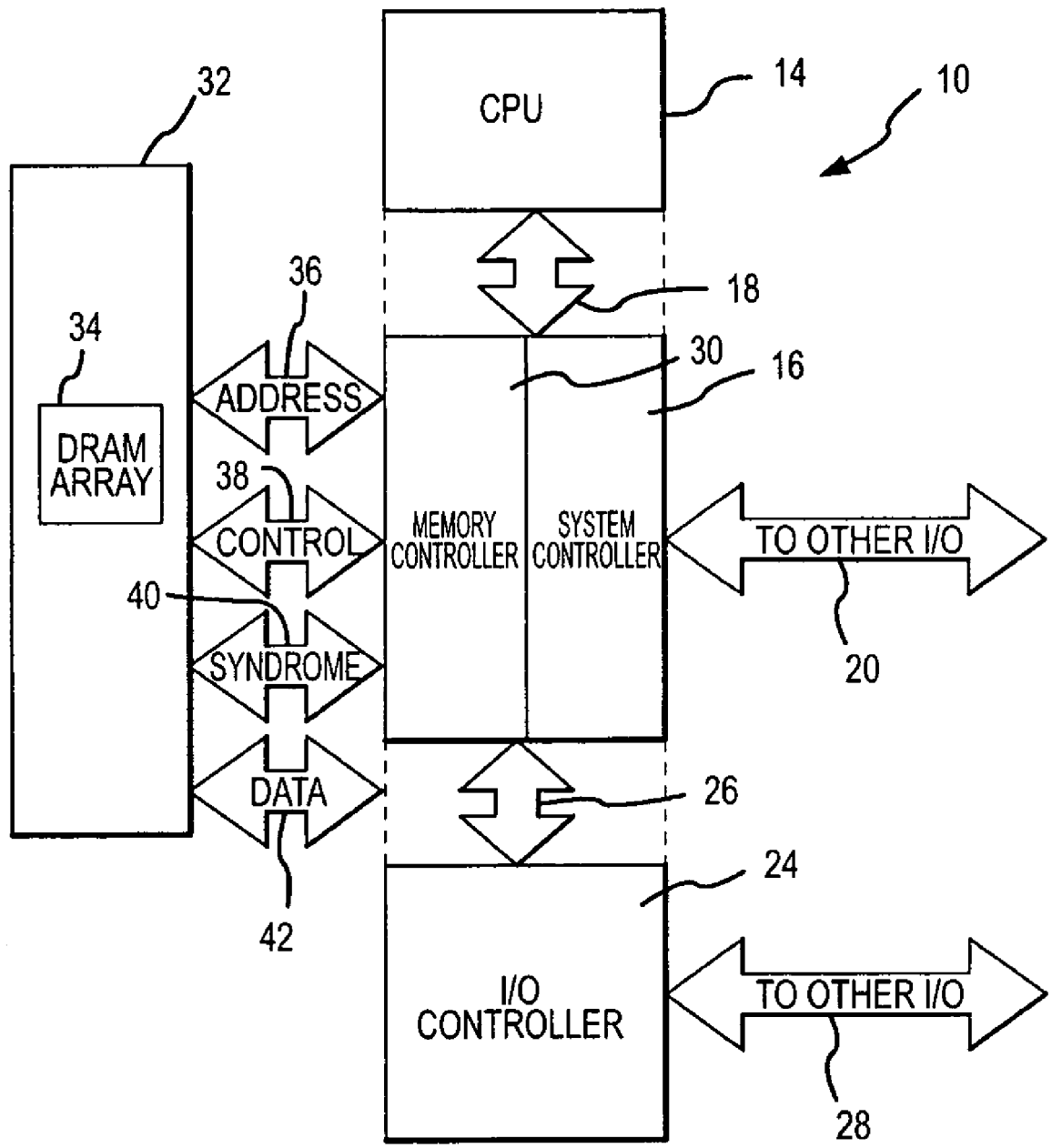
FIG. 1 is a block diagram of a conventional computer system.
Figure 2:
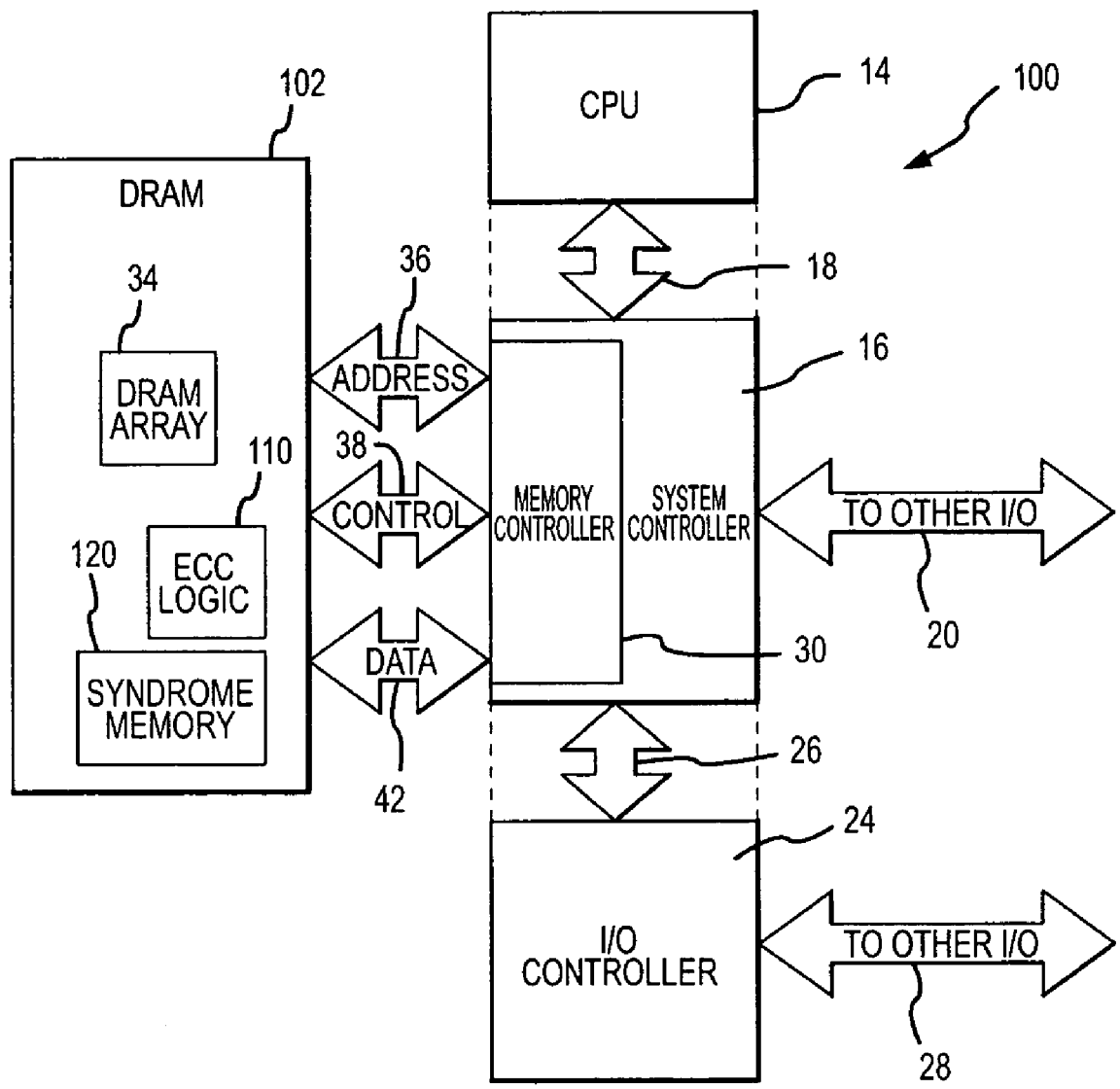
FIG. 2 is a block diagram of a computer system according to one embodiment of the invention.

A computer system 100 according to one embodiment of the invention is shown in FIG. 2. The computer system 100 uses many of the same components that are used in the conventional computer system 10 of FIG. 1. Therefore, in the interest of brevity, these components have been provided with the same reference numerals, and an explanation of their operation will not be repeated. The computer system 100 of FIG. 2 differs from the computer system 10 of FIG. 1 by including a DRAM 102 that includes a syndrome memory 120 and ECC logic 110, and by omitting a syndrome bus. The ECC logic 110 generates a syndrome from write data received from the memory controller 30, and stores the syndrome in the syndrome memory 120 while the write data are being stored in the DRAM array 34. When data are read from the DRAM array 34, the read data are coupled from the array 34 to the ECC logic 110 and the syndrome are coupled from the syndrome memory 120 to the ECC logic 110. The ECC logic 110 then uses the syndrome to determine if the read data contains an erroneous data bit, and, if more than one data bit is not in error, to correct the erroneous data bit. The corrected read data are then coupled to the memory controller 30 through the data bus 42. Although the syndrome memory 120 may be a separate memory as shown in FIG. 2, it may alternatively be included in the DRAM array 34, as explained in greater detail below.

The DRAM 102 is able to use ECC techniques with relatively little syndrome bit overhead by generating syndromes from a relatively wide data word. In one embodiment of the invention, a data bus 42 having a width of 32 bits is used. However, in that embodiment, the ECC logic 110 generates syndromes from 128-bit data words. Therefore, every write requires that 4 32-bit words be coupled through the data bus 42. As shown in Table 1, the 128 bit word requires a syndrome of only 8 bits, which achieves a syndrome bit overhead of only 6 percent.

Figure 3:
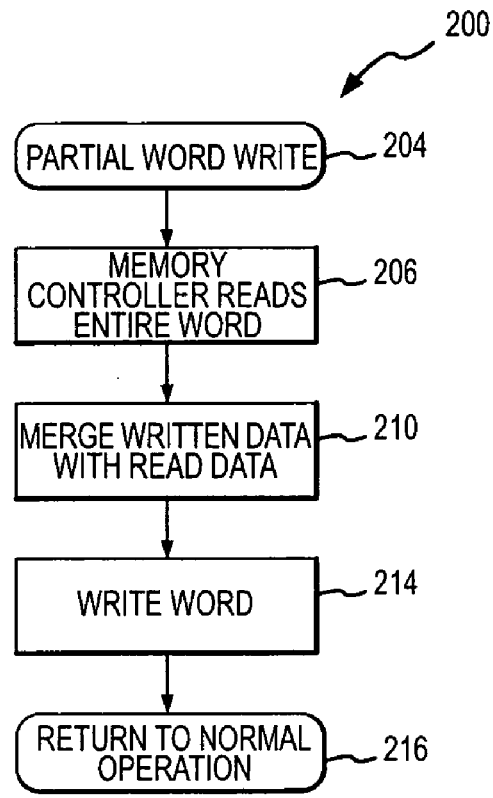
FIG. 3 is a flow chart showing the manner in which a partial data word is written in the computer system of FIG. 2 to allow a syndrome to be generated based on a full word.
Figure 4:
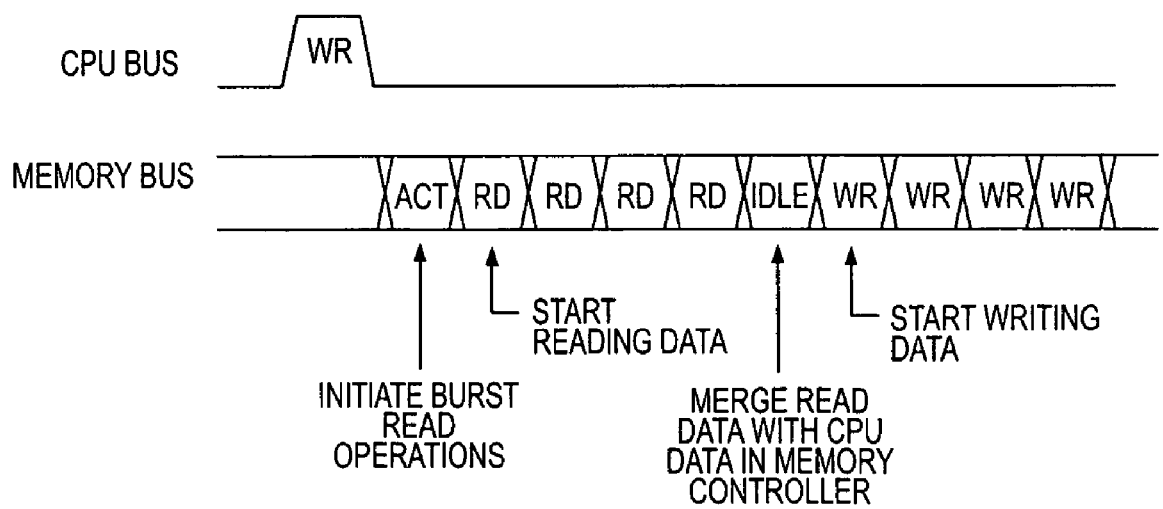
FIG. 4 is a timing diagram showing signals used to perform the operation shown in FIG. 3.

As mentioned above, the ECC logic 110 generates syndromes from 128-bit data words, but the memory controller 30 often writes data to the DRAM 102 in bytes consisting of 8 bits or some other number of bits less than 128 bits. To solve this problem the computer system 100 operates in a manner that allows the ECC logic 110 to generate a syndrome when only 8 bits, or data having less than 128 bits, are being written to the DRAM 102. The manner in which the computer system 100 operates in this manner will now be explained with reference to a flow chart 200 shown in FIG. 3 and a timing diagram shown in FIG. 4. In explaining the operation of the computer system 100, the assumption will be made that the data bus 42 has a width of 32 bits, and the CPU 14 is writing a partial word of 8 bits. With reference to FIG. 3, the partial word write 200 is entered at 204 when the CPU 14 places a write ("WR") command on the CPU bus 18, as shown in FIG. 4. The memory controller 30 then reads the entire 128-bit word that encompasses the address to which the 8-bits are to be written at step 206. This read is accomplished by the memory controller 30 coupling an active row command ("ACT") to the DRAM 102 through the control bus 38, as shown in FIG. 4. Four 32-bit words that encompass the 128-bit word are then coupled from the DRAM 102 to the memory controller 30 through the data bus 42 responsive to four read ("RD") commands coupled through the control bus 38. The 8-bits bits to be written to the DRAM 102 are then substituted for corresponding bits in one of the 32-bit words read from the DRAM 102 at step 210. The memory controller 30 then formulates a new 128-bit word from three of the 32-bit words that were read from the DRAM 102 and the new 32-bit word containing the 8 new bits and 24 bits read from the DRAM 102. After an idle period ("Idle") shown in FIG. 4, the new 128-bit word is written to the DRAM 102 at step 214 by coupling 4 write commands ("WR") to the DRAM 102 through the control bus 38, as also shown in FIG. 4. The ECC logic 110 receives the 4 32-bit words that constitute the 128-bit word, generates an 8-bit syndrome from the 128-bit word. The 128-bit word is then written to the DRAM array 34 and the 8-bit syndrome is written to the syndrome memory 120. The computer system then returns to normal operation through step 216.

Although the operation of the computer system 100 has been explained in the context of a system 100 having a 32-bit data bus 42 and ECC logic that generates a syndrome from 128-bit data words formed by 4 32-bit words, it will be understood that computer systems may use data buses having different widths, and the word from which the syndrome is formed, which may be other than 128 bits, may be formed by a lesser or greater number of smaller words, such as words having 32-bits.

Figure 5:
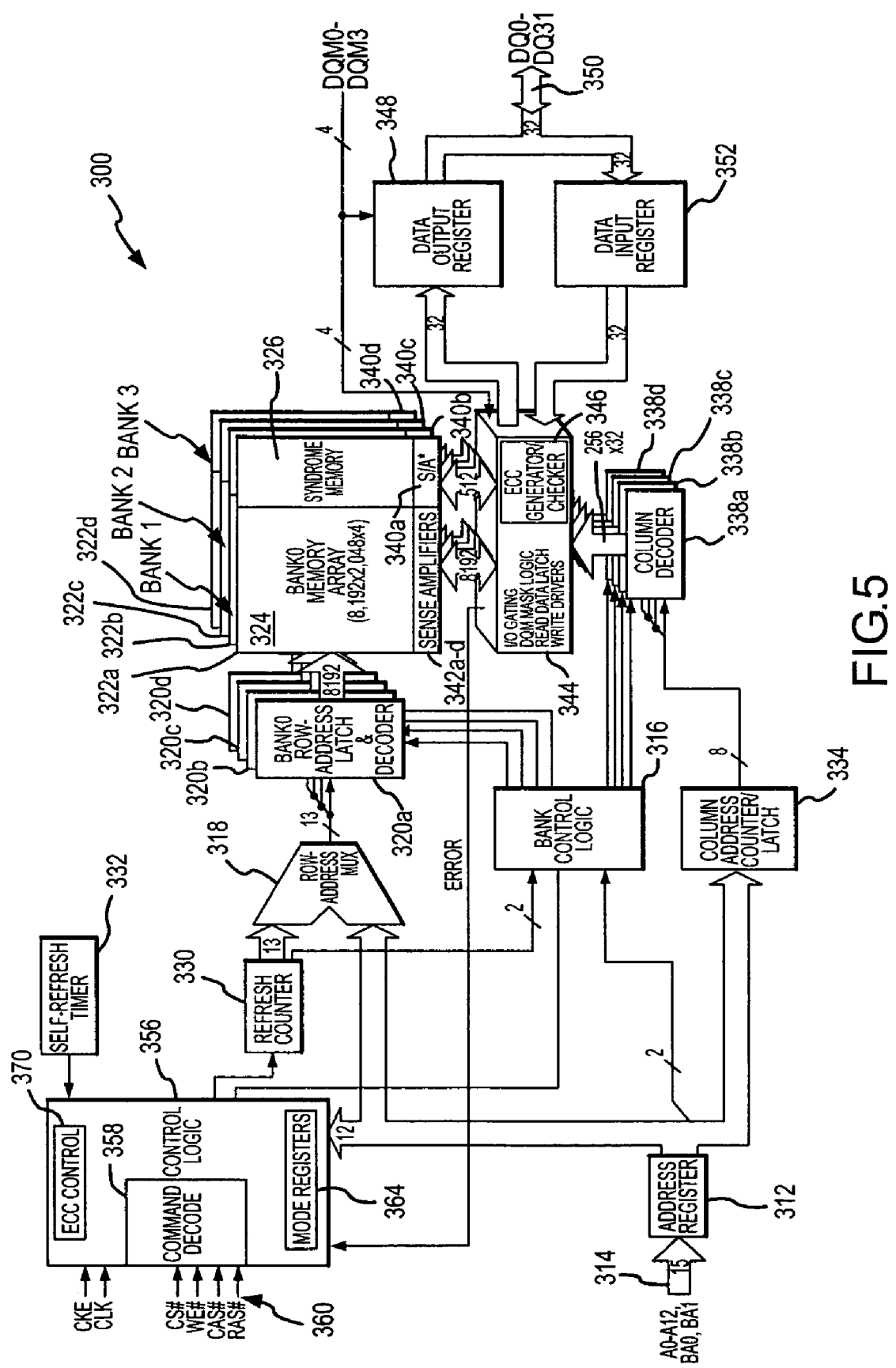
FIG. 5 is a block diagram of a memory device according to one embodiment of the invention that may be used in the computer system of FIG. 2.

A synchronous DRAM ("SDRAM") 300 according to one embodiment of the invention is shown in FIG. 5. The SDRAM 300 includes an address register 312 that receives bank addresses, row addresses and column addresses on an address bus 314. The address bus 314 is generally coupled to a memory controller (not shown in FIG. 5). Typically, a bank address is received by the address register 312 and is coupled to bank control logic 316 that generates bank control signals, which are described further below. The bank address is normally coupled to the SDRAM 300 along with a row address. The row address is received by the address register 312 and applied to a row address multiplexer 318. The row address multiplexer 318 couples the row address to row address latch & decoder circuit 320*a-d* for each of several banks of memory cell arrays 322*a-d*, respectively. Each bank 320*a-d* is divided into two sections, a data second 324 that is used for storing data, and a syndrome section 326 that is used for storing syndromes. Thus, unlike the SDRAM 102 of FIG. 2, a separate syndrome memory 120 is not used in the SDRAM 300 of FIG. 5.

One of the latch & decoder circuits 320*a-d* is enabled by a control signal from the bank control logic 316 depending on which bank of memory cell arrays 322*a-d* is selected by the bank address. The selected latch & decoder circuit 320 applies various signals to its respective bank 322 as a function of the row address stored in the latch & decoder circuit 320. These signals include word line voltages that activate respective rows of memory cells in the banks 322. The row address multiplexer 318 also couples row addresses to the row address latch & decoder circuits 320*a-d* for the purpose of refreshing the memory cells in the banks 322*a-d*. The row addresses are generated for refresh purposes by a refresh counter 330. During operation in a self-refresh mode, the refresh counter 330 periodically begins operating at times controlled by a self-refresh timer 332.

After the bank and row addresses have been applied to the address register 312, a column address is applied to the address register 312. The address register 312 couples the column address to a column address counter/latch circuit 334. The counter/latch circuit 334 stores the column address, and, when operating in a burst mode, generates column addresses that increment from the received column address. In either case, either the stored column address or incrementally increasing column addresses are coupled to column address & decoders 338*a-d* for the respective banks 322*a-d*. The column address & decoders 338*a-d* apply various signals to respective sense amplifiers 340*a-d* and 342*a-d* through column interface circuitry 344. The column interface circuitry 344 includes conventional I/O gating circuits, DQM mask logic, read data latches for storing read data from the memory cells in the banks 322 and write drivers for coupling write data to the memory cells in the banks 322. The column interface circuitry 344 includes the ECC generator/checker 346 that is the ECC logic 110 in the DRAM 102 of FIG. 2.

Syndromes read from the syndrome section 326 of one of the banks 322*a-d* are sensed by the respective set of sense amplifiers 340*a-d* and then coupled to the ECC generator checker 346. Data read from the data section 324 one of the banks 322*a-d* are sensed by the respective set of sense amplifiers 342*a-d* and then stored in the read data latches in the column interface circuitry 344. The data are then coupled to a data output register 348, which applies the read data to a data bus 350. Data to be written to the memory cells in one of the banks 322*a-d* are coupled from the data bus 350 through a data input register 352 to write drivers in the column interface circuitry 344. The write drivers then couple the data to the memory cells in one of the banks 322*a-d*. A data mask signal "DQM" is applied to the column interface circuitry 344 and the data output register 348 to selectively alter the flow of data into and out of the column interface circuitry 344, such as by selectively masking data to be read from the banks of memory cell arrays 322*a-d*.

The above-described operation of the SDRAM 300 is controlled by control logic 356, which includes a command decoder 358 that receives command signals through a command bus 360. These high level command signals, which are typically generated by a memory controller (not shown in FIG. 5), are a clock a chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 356 also receives a clock signal CLK and a clock enable signal CKE#, which cause the SDRAM 300 to operate in a synchronous manner. The control logic 356 generates a sequence of control signals responsive to the command signals to carry out the function (e.g., a read or a write) designated by each of the command signals. The control logic 356 also applies signals to the refresh counter 330 to control the operation of the refresh counter 330 during refresh of the memory cells in the banks 322. The control signals generated by the control logic 356, and the manner in which they accomplish their respective functions, are conventional. Therefore, in the interest of brevity, a further explanation of these control signals will be omitted.

The control logic 356 also includes a mode register 364 that may be programmed by signals coupled through the command bus 360 during initialization of the SDRAM 300. The mode register 364 then generates mode control signals that are used by the control logic 356 to control the operation of the SDRAM 300 in various modes. Finally, the control logic 356 also includes an ECC controller 370 that causes the control logic 356 to issue control signals to the ECC generator checker 346 and other components to generate syndromes for storage in the syndrome section 326 of the banks 322a-d, and to check and correct data read from the data section 324 of the banks 322a-d using syndromes stored in the sections 326.

Figure 6:
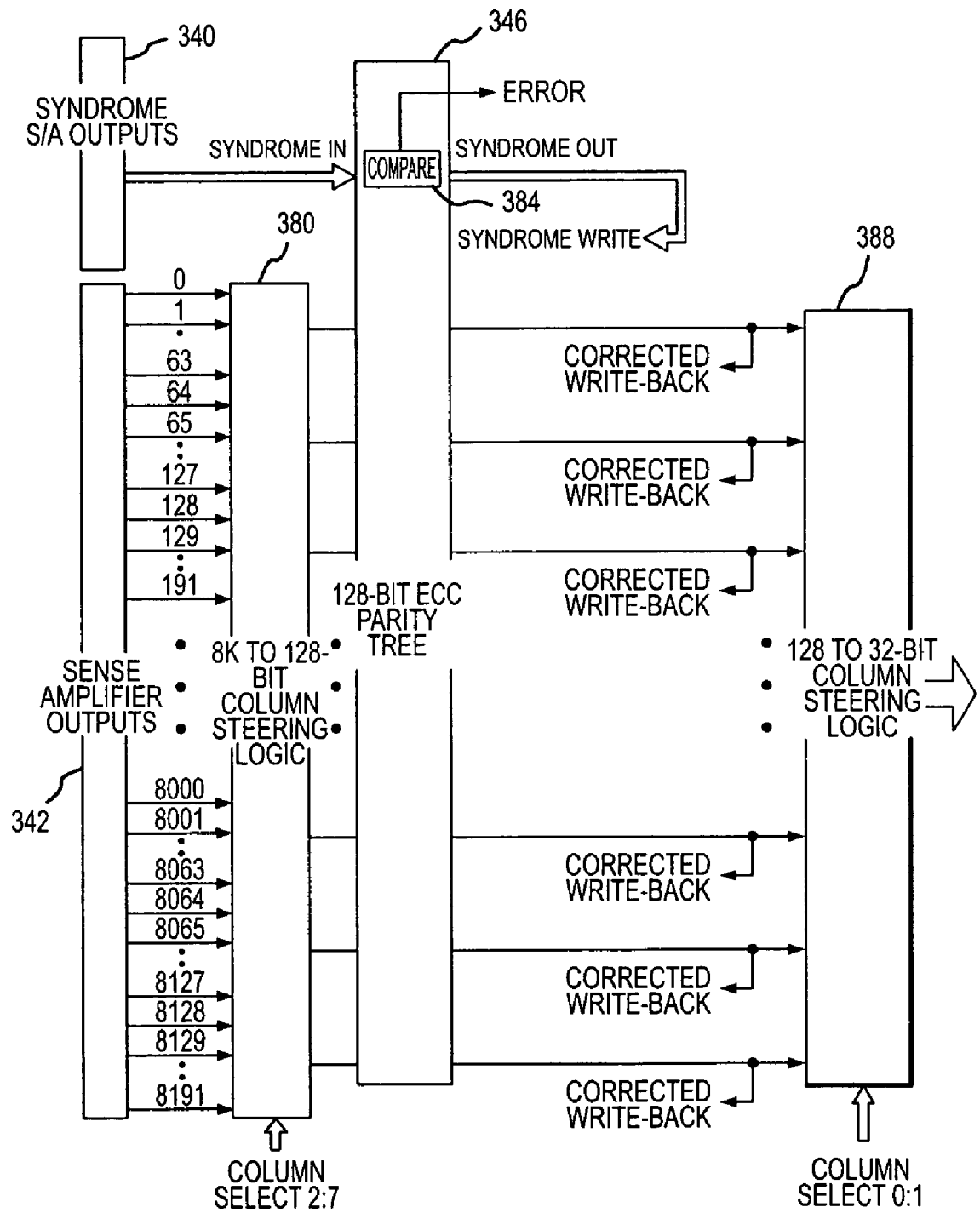
FIG. 6 is a block diagram showing a portion of the memory device of FIG. 5 in greater detail.

The interfaces between the sense amplifiers 340, 342, the ECC generator/checker 346 and certain components in the column interface circuitry 344 are shown in greater detail in FIG. 6. The sense amplifiers 342 coupled to the data sections 342 of the memory banks 322a-d output respective data bits for respective columns, which are applied to column steering logic 380. In the embodiment shown in FIG. 6, the sense amplifiers 342 output respective data bits for 8,192 columns. The column steering logic 380 uses the 6 most significant bits 2-7 of a column address to select 1 of 64 128-bit groups of data bits and couples the data bits to the ECC generator/checker 346. The sense amplifiers 340 coupled to the syndrome section of the memory banks 322a-d couple a syndrome corresponding to the read data directly to the ECC generator/checker 346.

The ECC generator/checker 346 includes a comparator 384 that provides an error indication in the event the read data contains an error. The ECC generator/checker 346 then couples the corrected 128-bit word to additional column steering logic 388, and also couples the corrected 128-bit word back through the column steering logic 380 to the banks 322a-d so that the banks will now contain correct data. The column steering logic 388 uses the 2 least significant bits 0-1 of a column address to select 1 of 4 32-bit groups of data bits and couples the data bits to the memory controller 30 (FIG. 2), as previously explained. It is not necessary for the column steering logic 388 to couple the syndrome to the memory controller 30 so that the operation error checking and correction function is transparent to the memory controller 30. Also, although 128 bits of write data are used to form the syndrome, it is not necessary for the memory device 102 to include externally accessible data terminals for each of these 128 bits.

Although the present invention has been described with reference to the disclosed embodiments, persons skilled in the art will recognize that changes may be made in form and detail without departing from the spirit and scope of the invention. For example, although the 128-bit write data word has been described of as being formed from 96 bits of read data and 8 bits of new write data, it will be understood that the 128-bit write data may be formed by other means.

I claim:

1. A memory device, comprising:
an array of memory cells arranged in rows and columns; and
error checking and correcting (ECC) logic coupled to the array of memory cells, the ECC logic configured to generate an error checking and correcting syndrome in the memory device from data written to the array of memory cells, the ECC logic further configured to use the syndrome to check and correct data read from the array of memory cells, the syndrome generated from more data bits than a number of data bus terminals of the memory device but less than the number of memory cells in the row containing the memory cells to which the data is being written.

2. The memory device of claim 1, further comprising:
an address decoder coupled to the array of memory cells, the address decoder operable to receive row addresses and column addresses, the address decoder further configured to activate a row of memory cells corresponding to a received row address and to select a memory cell in a column of memory cells corresponding to a received column address;
a read data path coupled to the ECC logic, the read data path configured to couple read data from selected memory cells in an activated row to the data bus terminals;
a write data path coupled to the ECC logic, the write data path configured to couple write data from the data bus terminals to selected memory cells in an activated row; and
control logic coupled to the ECC logic, the control logic configured to cause the write data to be coupled from the data bus terminals to the array of memory cells and to cause the read data to be coupled from the array of memory cells to the plurality of data bus terminals.

3. The memory device of claim 2 wherein the read data path comprises a column interface circuitry containing the ECC logic.

4. The memory device of claim 3 wherein the column interface circuitry comprises:
a first set of column steering logic coupled to the array of memory cells, the first set of column steering logic configured to select a set of read data bits from a corresponding set of columns of the array of memory cells and to couple the selected set of read data bits to the ECC logic; and
a second set of column steering logic configured to the ECC logic, the second set of column steering logic configured to select a subset of read data bits from the set of read data bits selected by the first set of column steering logic and coupled to the ECC logic.

5. The memory device of claim 2 wherein the control logic comprises an ECC controller coupled to the ECC logic for controlling the operation of the ECC logic.

6. The memory device of claim 1, further comprising a syndrome memory coupled to the ECC logic, the syndrome memory configured to store the generated syndrome and to couple the stored syndrome to the ECC logic, the ECC logic using the syndrome to check and correct data that are read from the array of memory cells.

7. The memory device of claim 6 wherein the syndrome memory comprises the array of memory cells which the write data are written to and the read data are read from.

8. The memory device of claim 6 wherein the syndrome memory comprises a storage device that is separate from the array of memory cells which the write data are written to and the read data are read from.

9. The memory device of claim 1 wherein the memory device comprises a dynamic random access memory (DRAM) memory device.

10. The memory device of claim 1 wherein the syndrome generated from more data bits than a number of data bus terminals of the memory device comprises a syndrome generated from N of M-bit data that are sequentially coupled to the data bus terminals of the memory device to be written to the array of memory cells, where M is a positive integer representing a number of data bus terminals of the memory device, and where N is a positive integer greater than one.

11. The memory device of claim 10 where in M is equal to 32, and N is equal to 4.

12. A computer system, comprising:
a processor;
a memory device, comprising:

an array of memory cells arranged in rows and columns; and error checking and correcting (ECC) logic coupled to the array of memory cells, the ECC logic configured to generate an error checking and correcting syndrome in the memory device from data written to the array of memory cells, the ECC logic further configured to use the syndrome to check and correct data read from the array of memory cells, the syndrome generated from more data bits than a number of data bus terminals of the memory device but less than the number of memory cells in the row containing the memory cells to which the data is being written; and a memory controller coupled to the processor and to the memory device, the memory controller configured to cause the memory device to write data and to read data.

13. The computer system of claim 12 wherein the memory device further comprises:

an address decoder coupled to the array of memory cells, the address decoder configured to receive row addresses and column addresses, the address decoder further operable to activate a row of memory cells corresponding to a received row address and to select a memory cell in a column of memory cells corresponding to a received column address;

a read data path coupled to the ECC logic, the read data path configured to couple read data from selected memory cells in an activated row to the data bus terminals;

a write data path coupled to the ECC logic, the write data path configured to couple write data from the data bus terminals to selected memory cells in an activated row; and control logic coupled to the ECC logic, the control logic configured to cause the write data to be coupled from the data bus terminals to the array of memory cells and to cause the read data to be coupled from the array of memory cells to the plurality of data bus terminals.

14. The computer system of claim 13 wherein the read data path comprises a column interface circuitry containing the ECC logic.

15. The computer system of claim 14 wherein the column interface circuitry comprises:

a first set of column steering logic coupled to the array of memory cells, the first set of column steering logic configured to select a set of read data bits from a corresponding set of columns of the array of memory cells and to couple the selected set of read data bits to the ECC logic; and a second set of column steering logic coupled to the ECC logic, the second set of column steering logic configured to select a subset of read data bits from the set of read data bits selected by the first set of column steering logic and coupled to the ECC logic.

16. The computer system of claim 13 wherein the control logic comprises an ECC controller coupled to the ECC logic for controlling the operation of the ECC logic.

17. The computer system of claim 12 wherein the memory device further comprises a syndrome memory coupled to the ECC logic, the syndrome memory configured to store the generated syndrome and to couple the stored syndrome to the ECC logic so that the ECC logic can use the syndrome to check and correct data that are read from the array of memory cells.

18. The computer system of claim 17 wherein the syndrome memory comprises the array of memory cells which the write data are written to and the read data are read from.

19. The computer system of claim 17 wherein the syndrome memory comprises a storage device that is separate from the array of memory cells which the write data are written to and the read data are read from.

20. The computer system of claim 12 wherein the memory device comprises a dynamic random access memory (DRAM) memory device.

21. The computer system of claim 12 wherein the syndrome generated from more data bits than a number of data bus terminals of the memory device comprises a syndrome generated from N of M-bit data that are sequentially coupled to the data bus terminals of the memory device to be written to the array of memory cells, where M is a positive integer representing a number of data bus terminals of the memory device, and where N is a positive integer greater than one.

22. The computer system of claim 21 where in M is equal to 32, and N is equal to 4.

23. A memory system, comprising:

a memory controller configured to output a memory write command and a memory read command, and further configured to transmit write data and to receive read data; and a memory device coupled to the memory controller, the memory device comprising:

an array of memory cells arranged in rows and columns; and error checking and correcting (ECC) logic coupled to the array of memory cells, the ECC logic configured to generate an error checking and correcting syndrome in the memory device from write data that are written to the array of memory cells, the ECC logic further configured to use the syndrome to check and correct read data that are read from the array of memory cells, the syndrome generated from more data bits than a number of data bus terminals of the memory device device but less than the number of memory cells in the row containing the memory cells to which the data are being written; and control logic coupled to the ECC logic, the control logic configured to cause the write data to be coupled to the array of memory cells responsive to the memory write command, and to cause the read data to be coupled from the array of memory cells responsive to the memory read command.

24. The memory system of claim 23 wherein the memory device further comprises:

an address decoder coupled to the array of memory cells, the address decoder configured to receive row addresses and column addresses from the memory controller, the address decoder further configured to activate a row of memory cells corresponding to a received row address and to select a memory cell in a column of memory cells corresponding to a received column address;

a read data path coupled to the ECC logic, the read data path configured to couple the read data from selected memory cells in an activated row to the memory controller; and a write data path coupled to the ECC logic, the write data path configured to couple the write data from the memory controller to selected memory cells in an activated row.

25. The memory system of claim 24 wherein the read data path comprises a column interface circuitry containing the ECC logic.

26. The memory system of claim 25 wherein the column interface circuitry comprises:

a first set of column steering logic coupled to the array of memory cells, the first set of column steering logic configured to select a set of read data bits from a corresponding set of columns of the array of memory cells and to couple the selected set of read data bits to the ECC logic; and a second set of column steering logic coupled to the ECC logic, the second set of column steering logic configured to select a subset of read data bits from the set of read data bits selected by the first set of column steering logic and coupled to the ECC logic.

27. The memory system of claim 23 wherein the memory device further comprises a syndrome memory coupled to the ECC logic, the syndrome memory configured to store the generated syndrome, and wherein the ECC logic is configured to obtain the syndrome from the syndrome memory for use in checking and correcting the read data coupled from the memory device to the memory controller.

28. The memory system of claim 27 wherein the syndrome memory comprises the array of memory cells which the write data are written to and the read data are read from.

29. The memory system of claim 27 wherein the syndrome memory comprises a storage device that is separate from the array of memory cells which the write data are written to and the read data are read from.

30. The memory system of claim 23 wherein the memory device comprises a dynamic random access memory (DRAM) memory device.

31. The memory system of claim 23 wherein the memory controller comprises a memory controller configured to transmit at least one M-bit word of write data and to receive at least one M-bit word of read data, where M is a positive integer.

32. The memory system of claim 31 wherein the memory controller comprises a memory controller operable to:
  read P M-bit words from the memory device;
  combine the P M-bit words read from the memory device with N minus P M-bit words to create N M-bit words, where N is a positive integer greater than one, and P is a positive integer less than N; and
  couple the created N M-bit words to the memory device to allow the ECC logic to use the created N M-bit words to generate the syndrome.

33. The memory system of claim 32 wherein M is equal to 32, N is equal to 4, and P is equal to 3.

34. The memory system of claim 23 wherein the memory controller comprises a memory controller configured to sequentially couple N M-bit words of write data to the memory device, where M is a positive integer, and where N is a positive integer greater than one.

35. The memory system of claim 34 wherein M is equal to 32, and N is equal to 4.

36. A method of error checking and correcting in a memory device having an array of memory cells arranged in rows and columns, comprising:
  simultaneously receiving a set of N write data bits at the memory device;
  writing the set of write data bits to a row of memory cells in the memory device;
  generating an error checking and correcting syndrome in the memory device from data written to the array of memory cells, the syndrome generated from M bits of the write data where M is a positive integer greater than N but less than the number of memory cells in the row of memory cells to which the write data is being written; and
  using the syndrome to check and correct data read from the memory device.

37. The method of claim 36 wherein generating the error checking and correcting syndrome from data written to the array of memory cells of the memory device comprises generating an error checking and correcting syndrome from a plurality of data words that are sequentially coupled to the memory device, each of the plurality of data words having N bits.

38. The method of claim 36 wherein using the syndrome to check and correct data read from the memory device comprises using the syndrome corresponding to the data being read from the memory device to check and correct the data.

39. The method of claim 36 wherein using the syndrome to check data read from the memory device comprises using the syndrome corresponding to the data being read from the memory device to determine if any data bit of the data being read from the memory device to be erroneous.

40. The method of claim 36 wherein using the syndrome to correct data read from the memory device comprises using the syndrome corresponding to the data being read from the memory device to correct an erroneous data bit of the data being read from the memory device.

41. The method of claim 40, further comprising providing the corrected data to be coupled from the memory device, and storing the corrected data in the memory device.

42. The method of claim 36, further comprising storing the syndrome within the memory device.

43. The method of claim 42 wherein storing the syndrome within the memory device comprises storing the syndrome in the array of memory cells in which the data written to the memory device are stored.

44. The method of claim 42 wherein storing the syndrome within the memory device comprises storing the syndrome in a storage device that is separate from the array of memory cells in which the data written to the memory device are stored.

45. The method of claim 36 wherein the memory device comprises a dynamic random access memory (DRAM) memory device.

46. A method of writing data to a memory device having an array of memory cells, comprising:
  providing an address word containing an address to which write data is written in the array of memory cells, the address word having more bits than the write data, the address word further having more bits than a number of data bus terminals of the memory device;
  writing a modified address word to a row of memory cells in the memory device, the modified address word comprising the write data, the modified address word having the same number of bits as the provided address word but less than the number of memory cells in the row to which the modified address word is being written; and
  generating an error checking and correcting syndrome in the memory device from the modified address word.

47. The method of claim 46 wherein the modified address word comprises the write data and a portion of the provided address word.

48. The method of claim 46, further comprising storing the syndrome within the memory device.

49. The method of claim 48 wherein storing the syndrome within the memory device comprises storing the syndrome in the array of memory cells in which the data written to the memory device are stored.

50. The method of claim 48 wherein storing the syndrome within the memory device comprises storing the syndrome in a storage device that is separate from the array of memory cells in which the data written to the memory device are stored.

51. The method of claim 46 wherein the memory device comprises a dynamic random access memory (DRAM) memory device.

52. A method of writing data to a memory device having an array of memory cells, comprising:
  receiving a command;
  providing an address word in response to the command, the address word containing an address to which write data is written in the array of memory cells, the address word having more bits than the write data, the address word further having more bits than a maximum number of data bus terminals of the memory device;
  receiving a modified address word, the modified address word comprising the write data, the modified address word having the same number of bits as the provided address word but less than the number of memory cells in a row to which the modified address word is to be stored;
  storing the modified address word in the row of memory cells in the array of memory cells; and
  generating an error checking and correcting syndrome in the memory device from the modified address word.

53. The method of claim 52 wherein the modified address word comprises the write data and a portion of the provided address word.

54. The method of claim 52, further comprising storing the syndrome within the memory device.

55. The method of claim 54 wherein storing the syndrome within the memory device comprises storing the syndrome in the array of memory cells in which the data written to the memory device are stored.

56. The method of claim 54 wherein storing the syndrome within the memory device comprises storing the syndrome in a storage device that is separate from the array of memory cells in which the data written to the memory device are stored.

57. The method of claim 52 wherein the memory device comprises a dynamic random access memory (DRAM) memory device.

* * * * *

UNITED STATES PATENT AND TRADEMARK OFFICE
CERTIFICATE OF CORRECTION

PATENT NO. : 7,526,713 B2  Page 1 of 2
APPLICATION NO. : 11/432009
DATED : April 28, 2009
INVENTOR(S) : Klein It is certified that error appears in the above-identified patent and that said Letters Patent is hereby corrected as shown below:

In column 1, lines 7-8, delete "This application is a continuation of pending U.S. patent application Ser. No. 10/877,720, filed Jun. 25, 2004." and insert -- This application is a continuation of U.S. patent application Ser. No. 10/877,720, filed Jun. 25, 2004, now Pat. No. 7,340,668. --, therefor.

In column 7, line 67, in Claim 2, delete "operable" and insert -- configured --, therefor.

In column 8, line 7, in Claim 2, delete "configured" and insert -- operable --, therefor.

In column 8, line 30, in Claim 4, delete "configured" and insert -- coupled --, therefor.

In column 8, line 63, in Claim 11, delete "where in" and insert -- wherein --, therefor.

In column 9, lines 21-22, in Claim 13, delete "operable" and insert -- configured --, therefor.

In column 10, line 16, in Claim 22, delete "where in" and insert -- wherein --, therefor.

In column 10, line 32, in Claim 23, delete "configured" and insert -- operable --, therefor.

In column 10, line 36, in Claim 23, delete second word "device".

In column 10, line 51, in Claim 24, delete "configured" and insert -- operable --, therefor.

UNITED STATES PATENT AND TRADEMARK OFFICE
CERTIFICATE OF CORRECTION

PATENT NO. : 7,526,713 B2
APPLICATION NO. : 11/432009
DATED : April 28, 2009
INVENTOR(S) : Klein It is certified that error appears in the above-identified patent and that said Letters Patent is hereby corrected as shown below:

In column 11, line 62, in claim 36, delete "data" and insert -- data, --, therefor.

Signed and Sealed this

Eighth Day of September, 2009

David J. Kappos
*Director of the United States Patent and Trademark Office*